(12) United States Patent
Dirksen et al.

(10) Patent No.: US 6,544,694 B2
(45) Date of Patent: Apr. 8, 2003

(54) METHOD OF MANUFACTURING A DEVICE BY MEANS OF A MASK PHASE-SHIFTING MASK FOR USE IN SAID METHOD

(75) Inventors: Peter Dirksen, Eindhoven (NL); Casparus Anthonius Henricus Juffermans, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 108 days.

(21) Appl. No.: 09/772,485

(22) Filed: Jan. 29, 2001

(65) Prior Publication Data

US 2001/0021477 A1 Sep. 13, 2001

(30) Foreign Application Priority Data

Mar. 3, 2000 (EP) .............................. 00200780

(51) Int. Cl.[7] .................................. G03F 9/00
(52) U.S. Cl. ....................................... 430/5
(58) Field of Search .................... 430/5, 322, 323, 430/324, 311; 716/20, 19

(56) References Cited

U.S. PATENT DOCUMENTS

| | | | |
|---|---|---|---|
| 4,251,160 A | 2/1981 | Bouwhuis et al. | 356/401 |
| 4,356,392 A | 10/1982 | Wittekoek et al. | 250/201 |
| 4,737,823 A | 4/1988 | Bouwer et al. | 355/53 |
| 4,778,275 A | 10/1988 | Van Den Brink et al. | 356/401 |
| 5,191,200 A | 3/1993 | Van Der Werf et al. | 250/201 |
| 5,242,770 A | 9/1993 | Chen et al. | 430/5 |
| 5,821,014 A | * 10/1998 | Chen et al. | 430/5 |
| 5,827,625 A | * 10/1998 | Lucas et al. | 430/5 |

FOREIGN PATENT DOCUMENTS

| | | |
|---|---|---|
| EP | 0498499 A1 | 8/1992 |
| EP | 0658810 A1 | 6/1995 |
| EP | 0680624 B1 | 11/1995 |
| WO | 9947981 A1 | 9/1999 |

OTHER PUBLICATIONS

Patent Abstracts of Japan, vol. 1995, No. 09, Oct. 1995 & JP 07 152144 A (NEC Corp), Jun. 1995, Abstract.
"Improving Resolution in Photolithography with a Phase-Shifting Mask", by Marc D. Levenson et al., IEEE Transactions on Electron Devices, vol. ED-2-9, No. 12, Dec. 1982.
"The Application of Alternating Phase-Shifting Masks to 140 nm Patterning (II): Mask Design and Manufacturing Tolerances", by Hua-Yu Liu et al., SPIE vol. 3334.

* cited by examiner

Primary Examiner—S. Rosasco
(74) Attorney, Agent, or Firm—Aaron Waxler

(57) ABSTRACT

A method is described for imaging, by means of projection radiation, a phase-shifting mask pattern on a substrate for the purpose of configuring device features in the substrate. By using a mask pattern comprising mask features constituted by a phase transition (22) and two sub-resolution assist features (40,41), arranged symmetrically with respect to the phase transition and having a mutual distance (p), device features having a wide variety of widths can be obtained by varying only the mutual distance.

13 Claims, 6 Drawing Sheets

METHOD OF MANUFACTURING A DEVICE BY MEANS OF A MASK PHASE-SHIFTING MASK FOR USE IN SAID METHOD

BACKGROUND OF THE INVENTION

The invention relates to a method of manufacturing a device in at least one layer on a substrate, comprising the steps of:

imaging, by means of projection radiation having a wavelength $\lambda$ and a projection system having a numerical aperture NA, a specific phaseshifting mask pattern, comprising pattern features corresponding to device features to be configured in said layer, on a radiation-sensitive layer provided on said layer, and removing material from, or adding material to, areas of said layer which are delineated by the mask pattern image, the smallest device features having a width which is smaller than $\lambda/NA$.

The invention also relates to a lithographic phaseshifting mask for use in this method.

The method is used, inter alia, in the manufacture of integrated electronic circuits, or IC, devices. An IC mask pattern, present in a mask, is imaged each time on a different IC area of a substrate. This substrate, which is coated with a radiation-sensitive layer, provides space for a large number of IC areas. The lithographic method may also be used in the manufacture of other devices like, for example, integrated or planar optical systems, charge-coupled detectors (CCDs), magnetic heads or liquid crystalline display panels.

Since it is desirable to accommodate an increasing number of electronic components in an IC device, increasingly smaller features, or line widths, of IC patterns must be imaged. Thus, increasingly stricter requirements are imposed on the lithographic projection apparatus used to carry out the lithographic method. The special requirements relate especially to the imaging quality and the resolving power of the projection system, which is usually a lens system in the current lithographic apparatus. The resolving power, or resolution, which is a measure of the smallest feature which can still be imaged satisfactorily, is proportional to $\lambda/NA$, in which $\lambda$ is the wavelength of the imaging, or projection, beam and NA is the numerical aperture of the projection system. To increase the resolution, the numerical aperture may, in principle, be increased and/or the wavelength may be reduced. In practice, an increase of the numerical aperture, which is currently already fairly large, is not very well possible because this reduces the depth of focus of the projection lens system, which is proportional to $\lambda/NA^2$ and, moreover, it becomes too difficult to correct for the required image field.

The requirements to be imposed on the projection lens system may be alleviated, or the resolution may be increased, while maintaining these requirements, if a step-and-scanning lithographic apparatus is used instead of a stepping lithographic apparatus. In a stepping apparatus, a full-field illumination is used, i.e. the entire mask pattern is illuminated in one operation and imaged as a whole on an IC area of the substrate. After a first IC area has been illuminated, a step is made to a subsequent IC area, i.e. the substrate holder is moved in such a way that the next IC area is positioned under the mask pattern, whereafter this area is illuminated, and so forth until all IC areas of the substrate are provided with an image of the mask pattern. In a step-and-scanning apparatus, only a rectangular or circular segment-shaped area of the mask pattern and hence also a corresponding sub-area of the substrate IC area is each time illuminated, and the mask pattern and the substrate are synchronously moved through the illumination beam, while taking the magnification of the projection lens system into account. A subsequent sub-area of the mask pattern is then each time imaged on a corresponding sub-area of the relevant IC area of the substrate. After the entire mask pattern has been imaged on an IC substrate area in this way, the substrate holder performs a stepping movement, i.e. the beginning of the next IC area is moved into the projection beam and the mask is set, for example, in its initial position whereafter said next IC area is scan-illuminated via the mask pattern.

If even smaller features are to be imaged satisfactorily with a stepping or a step-and-scanning lithographic apparatus, use can be made of a phase-shifting mask. The technique for improving resolution in photolithography by the use of phase-shifting masks was first proposed by Levenson et al in: "Improving Resolution in Photolithography with a Phase-Shifting Mask", IEEE Transactions on Electron Devices, Vol. ED-29, No.12, December 1982, pp 25–32. The Levenson phase-shifting mask is a conventional transmission mask which is provided with phase-shifting elements. This transmission mask comprises a transparent, for example, quartz substrate covered by an opaque, for example, chrome layer with apertures to define the desired intensity pattern, i.e. the IC pattern to be printed in a layer of the IC device. When illuminating such a conventional mask with electromagnetic radiation, the electric field of this radiation has the same phase at every aperture. However, due to diffraction at the apertures and the limited resolution of the projection lens system, the electric field patterns at the substrate level are spread. A single small mask aperture thus provides a wider intensity distribution at substrate level. Constructive interference between waves diffracted by adjacent apertures enhances the electric field between the projections of the apertures at substrate level. As the intensity pattern is proportional to the square of the electric field, this pattern of two adjacent mask apertures is spread evenly to a fairly high degree and does not show two pronounced peaks at the positions of the apertures.

In a phase-shifting mask, one of the two adjacent apertures is covered with a transparent phase-shifting layer. This layer has a thickness $d=\lambda/2(n-1)$, where n is the index of refraction and $\lambda$ is the wavelength of the radiation, such that the waves transmitted through the adjacent apertures are 180° out of phase with one another. Destructive interference now occurs between the waves diffracted by the adjacent apertures, and the electric field, and thus the intensity, between the projections of the apertures at wafer level is minimised. Any projection lens system will project the images of such a phase-shifting mask with a better resolution and a higher contrast than a corresponding mask without phase shifters.

A similar improvement can be obtained by a "chromeless" phase shifting mask, as disclosed in EP-A 0.680.624. This mask does not comprise a pattern structure of chrome, or other opaque material, which defines the IC pattern, but this pattern is now defined by a pattern of phase transitions, for example, in the form of recesses in the quartz substrate. Such a phase transition, or pattern feature, is imaged by the projection lens system in the radiation-sensitive, or resist, layer on the wafer as a narrow line, due to the point-spread function of this lens system. The line width is typically below 100 nm and can be influenced by the numerical aperture of the projection lens system, the coherence value and the exposure dose of the lithographic apparatus. The coherence value, or σ value, is the ratio of the cross-section of the projection beam in the plane of the pupil of the projection lens system and the aperture of this lens system. The σ value thus indicates the degree in which the projection lens pupil is filled by the projection beam. This value is usually smaller than one. The exposure dose is the amount of projection, or exposure, radiation incident on a resist layer area during imaging of a mask feature on this area. Once the numerical aperture, the coherence value and the exposure dose are set for a lithographic apparatus, all pattern features projected in the resist layer, and later configured in the IC device layer, have the same width.

If, as is usually the case, IC features with different widths should be formed in a device layer, it is not one mask but a number of masks, corresponding to the number of different widths, that should be projected on this layer. Each mask should then be projected with different values for the parameters NA, σ and exposure dose. This is a cumbersome and time-consuming process which would considerably increase the manufacturing time of an IC device or another device.

BRIEF SUMMARY OF THE INVENTION

It is an object of the present invention to solve the above problem and to provide a manufacturing method by means of which pattern features having considerably different widths can be configured in a device layer in one illumination step. This manufacturing method is characterized in that use is made of a mask pattern comprising mask features which are constituted by the combination of a phase transition determining the position of the imaged mask feature in the device layer and the length of the imaged feature, and two sub-resolution assist features flanking the phase transition and having a specific mutual distance which substantially determines the width of the imaged mask feature in the device layer.

A sub-resolution assist feature is a feature having such a small width that it is not resolved by the projection lens system of the lithographic apparatus, i.e. it is not imaged as such by the projection lens system. However, due to their diffractive effects, the two assist features flanking a phase transition determine the width of the image of this phase transition. This width of the phase transition image is mainly determined by the distance between the assist features. For example, by varying said distance between 200 nm and 600 nm, the width of a device feature can be set accurately to any value from 270 nm down to 50 nm. These dimensions are dimensions in the plane of the layer to be configured, i.e. dimensions at substrate level. Such a notation is commonly used in lithography. For a lithographic projection apparatus having a magnification M=¼, the feature dimensions at mask level are four times larger than the corresponding dimensions at substrate level.

The present invention is based on the recognition that the two functions of determining the position of a device feature and determining the width of this feature, which functions are performed in a conventional mask by one corresponding mask feature, can be separated and performed by three mask features. The position of the device feature in the device layer is determined by the position of the corresponding phase transition in the mask pattern, and the width of the device feature is determined by the two assist features. For printing device features with different widths, no special requirements have to be imposed on the lithographic apparatus. The assist features are not imaged, but improve the contrast of the phase transition image. As the assist features are not imaged, they can be used without any adaptation of the lithographic apparatus. By using the concept of the present invention, an existing lithographic apparatus can simultaneously print device features having different widths, ranging from very small to, for example, five times the minimum width.

The sub-resolution assist features can be characterized as scattering bars. It is to be noted that the use of scattering bars in the technique of optical lithography is known per se. For example, U.S. Pat. No. 5,242,770 relates to the problem that isolated features, i.e. features which have no other features in their neighbourhood, are imaged in the device layer as smaller device features than the images of densely packed mask features having the same width. To solve this problem, it is proposed to arrange an intensity gradient leveling bar, having a sub-resolution width and acting as a scattering bar, at each isolated edge of the isolated features. These leveling bars should adjust the edge intensity gradients of isolated edges in the mask pattern to the edge intensity gradients of densely packed edges. An intensity gradient leveling bar effects an increase of the width of the device feature of the order of 10% and thus performs a fine tuning of the device feature width. Moreover, all intensity gradient leveling bars are arranged at the same small distance from the isolated edges, which distance is of the order of 1.1 of the critical dimension of the device pattern. The mask used in the method described in U.S. Pat. No. 5,242,770 is not a phase-shifting mask, but an amplitude mask in the form of a clear field mask or a dark field mask.

PCT application WO 99/47981 proposes the use of sub-resolution features in an attenuated phase-shifting mask to solve another problem. The problem is that the image of an original mask feature, having a width which is larger than the minimal width, does not have a uniform intensity, but shows a certain intensity distribution. To solve this problem, the original mask feature, having a width of the order of 1 μm, is de-composed into an array of phase-shifted "imaging elements" which are separated by non-phase shifting and sub-resolution elements referred to as anti-scattering bars. Additional scattering bars may be arranged at the edges of the original mask feature to improve the depth of focus.

The method is preferably, further characterized in that the width of the imaged mask feature is tuned by adapting at least one of the following parameters:

the width of the assist features;

the transmission of the assist features, and the phase shift introduced by the assist features.

Adaptation of these parameters allows a fine tuning, and thus an optimisation, of the width of the device features.

A first embodiment of the method is characterized in that use is made of a mask pattern wherein the assist features are constituted by opaque strips.

The term opaque strip should be broadly interpreted as a strip which prevents radiation incident thereon from following the same path as radiation incident outside the strip. For a transmission mask, an opaque strip is a non-transmission strip, for example, a reflective or absorbing strip. For a reflection mask, an opaque strip is a non-reflective strip.

In principle, an assist feature may also be constituted by a phase transition. In order to prevent such an assist feature from being imaged in the resist layer it should be considerably smaller than an opaque strip having the same performance. A mask having phase transition assist features is more difficult to manufacture than a mask having opaque strip assist features.

A second, embodiment of the method which, in view of the mask manufacture is even preferred, is characterized in that use is made of a mask pattern wherein the assist features are constituted by radiation attenuation strips.

This embodiment uses the same principle as the method of patterning with an attenuated phase-shifting mask, described in the above-mentioned PCT application WO 99/47981. In the attenuated phase-shifting mask, the device features are strips showing a smaller transmission than their surroundings, whereby the difference in transmission is of the order of 5%. The assist features used in the method of the present invention have a transmission which is, for example, of the order of 75% of that of their surroundings. An assist feature with such a transmission may have a width which is, for example, of the order of 166% of the width of an opaque assist features, so that a mask pattern with attenuated assist feature is easier to manufacture than a mask pattern with opaque assist features.

The invention can also be implemented by means of the so-called trim mask technology. The method of configuring IC patterns by means of a trim mask is described in the article: "The application of alternating phase-shifting mask to 140 nm gate patterning (2); Mask design and manufacturing tolerances" in SPIE, VOL 3334, 1998, page 2. The trim mask method uses two masks which are successively projected on the same area of a substrate layer. The first mask is a phase-shifting mask with a phase transition at the position of a device feature, for example, a transistor gate. This mask is used exclusively to define the transistor gate. The second mask, i.e. the trim mask, is a chrome mask which protects the narrow gates defined by the first mask, removes unwanted edges produced by the exposure with the first mask and defines the remaining interconnect pattern. In the first mask, a device feature is defined by a 180° transition in a clear area. A chrome layer surrounds this area, which may be called a phase-shifting area. The width of this area determines the width of the image of the mask device feature. The width of the phase-shifting area can be chosen to be such that the variation of the feature image width, due to different kinds of projection lens aberrations, is minimised. However, this aberration-free imaging is possible only for one feature width, the optimum width.

In a third embodiment of the method of the invention, which is characterized in that use is made of a mask pattern wherein the phase transitions are arranged in phase-shifting areas which are embedded in opaque surroundings, and the assist features belonging to a specific phase transition are arranged within its phase-shifting area, the above-mentioned aberration-free imaging can be performed for different feature widths. The optimum feature width can now be varied over a wide range by changing the distance between the assist features.

The invention also relates to a phase-shifting mask for optically transferring a mask pattern, corresponding to a device layer structure, from said mask to a layer on a substrate of a device. This mask is characterized in that the mask pattern comprises mask features which are constituted by the combination of a phase transition determining the position of the imaged mask feature in the device layer and the length of the imaged mask feature, and two sub-resolution assist features flanking the phase transition and having a specific mutual distance, which distance substantially determines the width of the imaged mask feature in the device layer.

This mask may be further characterized in that the phase transitions are arranged in phase-shifting areas which are embedded in opaque surroundings, and the assist features belonging to a specific phase transition are arranged within its phase-shifting area.

Such a mask is suitable for use in the trim mask method.

A first embodiment of the mask is characterized in that the mask pattern is a transmission pattern.

A transmission mask pattern is usually applied in conventional lithography using UV and deep UV radiation.

A second embodiment of the mask is characterized in that the mask pattern is a reflective pattern.

The embodiments may be characterized in that the assist features are constituted by opaque strips.

The embodiments may be further characterized in that the material of the strips is chrome.

Chrome has proved to be a material which is very well suitable for delineating a mask pattern. It has been established that chrome is also very suitable for scattering bars in the new application according to the present invention.

Alternatively, the embodiments may be characterized in that the assist features are constituted by radiation attenuating strips.

The latter embodiments may be further characterized in that the material of the strips is a composition of molybdenum and silicon.

The transmission coefficient of the material MoSi renders this material very suitable for attenuating strips.

BRIEF DESCRIPTION OF THE DRAWINGS

These and other aspects of the invention are apparent from and will be elucidated, by way of non-limitative example, with reference to the embodiments described hereinafter.

In the drawings.

DETAILED DESCRIPTION OF THE INVENTION

Figure 1:
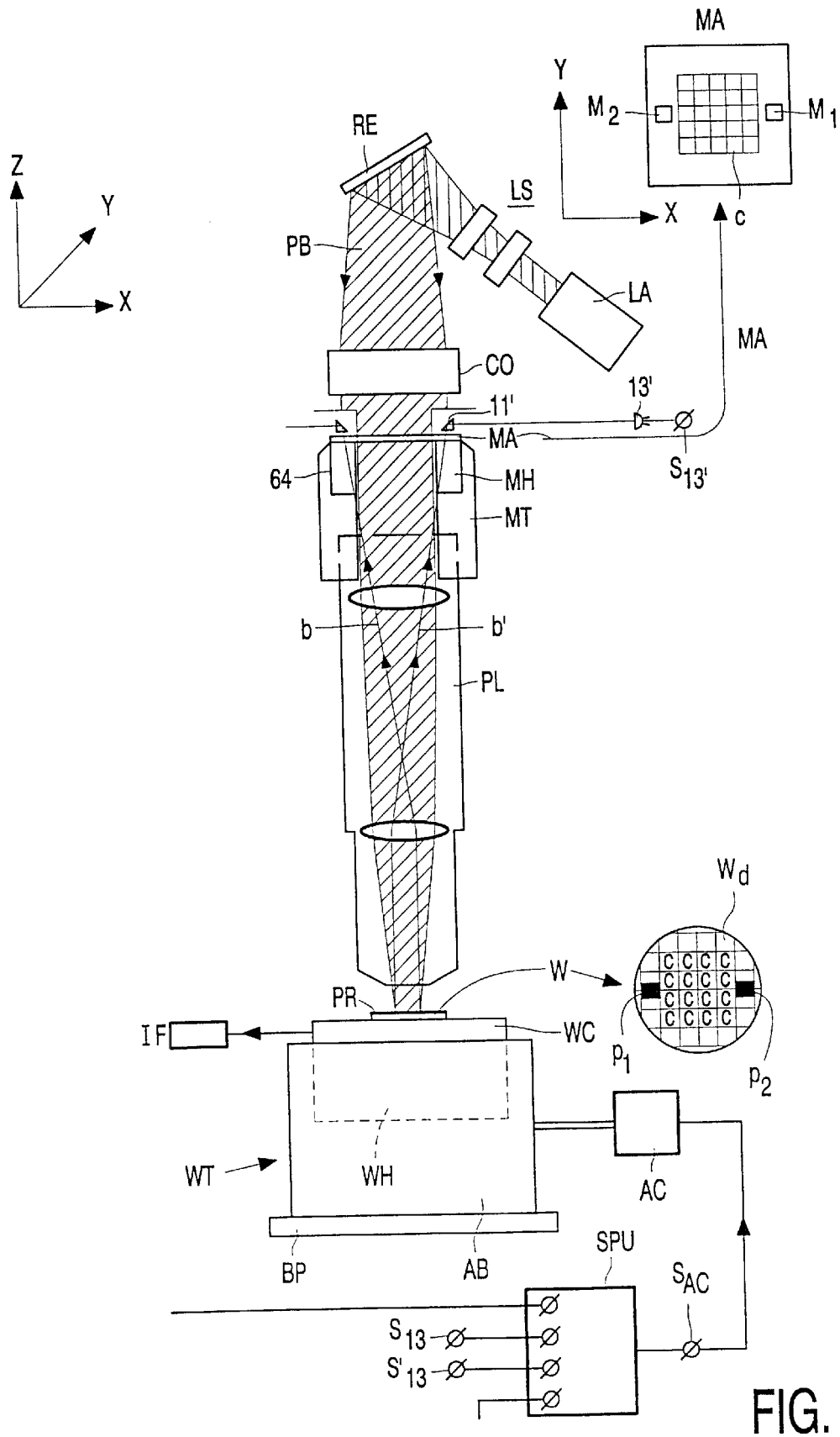
FIG. 1 shows schematically an embodiment of an optical lithographic projection apparatus by means of which the method can be performed.

The schematic diagram of FIG. 1 only shows the most important elements of an embodiment of a lithographic apparatus. This apparatus comprises a projection column accommodating a projection lens system PL. A mask holder MH for carrying a mask MA which comprises a mask pattern C to be imaged is arranged above this system. The mask holder forms part of a mask table MT. A substrate table WT is arranged in the projection column below the projection lens system PL. The substrate table accommodates a substrate holder WH for carrying a substrate W, for example, a semiconductor substrate, also called a wafer. This substrate is provided with a radiation-sensitive layer, for example, a photoresist, in which layer the mask pattern should be imaged a number of times, every time in another IC area Wd. The substrate table is movable in the X and Y-directions so that, after imaging the mask pattern into an IC area, a subsequent IC area can be positioned under the mask pattern.

The apparatus further comprises an illumination system provided with a radiation source LA, for example, a Krypton-Fluoride Excimer laser or a mercury lamp, a lens system LS, a reflector RE and a condensor lens CO. The projection beam PB supplied by the illumination system illuminates the mask pattern C. The projection lens system PL images this pattern in an IC area of the substrate W. The illumination system may be a system as described in EP-A 0.658.810. The projection lens system, for example, has a magnification M=¼, a numerical aperture NA=0.6 and a diffraction-limited image field with a diameter of 22 mm.

The apparatus is further provided with a number of measuring systems, namely an alignment system for mutually aligning, in the XY-plane, the mask MA and the substrate W, an interferometer system for measuring the X and Y-positions and the orientation of the substrate holder, and thus of the substrate, and a focus error detection system for determining a deviation between the focus, or image field of the projection lens system PL and the surface of the radiation-sensitive layer PR on the substrate. These measuring systems form part of servosystems which comprise electronic signal-processing and control circuits and actuators by means of which the position and orientation of the substrate and the focus can be corrected with reference to the signals supplied by the measuring systems.

The alignment system uses two alignment marks $M_1$ and $M_2$ in the mask MA, which mask is shown in the right top section of FIG. 1. These marks are, for example, diffraction gratings, but may also be constituted by other marks, like squares or strips, which are optically different from their surroundings. The alignment marks are preferably two-dimensional, i.e. they extend in two mutually perpendicular directions, the X- and Y-directions in FIG. 1. The substrate W comprises at least two alignment marks, two of which, $P_1$ and $P_2$, are shown in FIG. 1. The marks $P_1$ and $P_2$ are positioned outside the area of the substrate W where the images of the mask pattern have to be formed. Preferably, the grating marks $P_1$ and $P_2$ are phase gratings and the grating marks $M_1$ and $M_2$ are amplitude gratings. The alignment system may be a double alignment system wherein two alignment beams b and b' are used for aligning the substrate mark $P_2$ with respect to the mask mark $M_2$ and for aligning the substrate mark $P_1$ with respect to the mask mark $M_1$. After having traversed the alignment system, each alignment beam is incident on a radiation-sensitive detector 13 and 13", respectively, which converts the relevant beam into an electric signal which is indicative of the degree in which the substrate mark is aligned with respect to the wafer mark, and thus the substrate is aligned with respect to the mask. A double alignment system is described in U.S. Pat. No. 4,778,275, which is referred to for further details about this system.

For accurately determining the X and Y-positions of the substrate, the lithographic apparatus comprises a multiple-axis interferometer system, which is schematically indicated by the block IF in FIG. 1. A two-axis interferometer system is described in U.S. Pat. No. 4,251,160 and a three-axis system is described in U.S. Pat. No. 4,737,823. EP-A 0,498,499 describes a five-axis interferometer system by means of which both displacements along the X and Y-axes and the rotation about the Z-axis and tilts about the X and Y-axes can be measured very accurately.

In addition to a substrate interferometer system, a step-and-scanning lithographic apparatus also comprises a mask interferometer system.

As indicated in FIG. 1, the output signal Si of the interferometer system and the signals $S_{13}$ and $S_{13}'$ of the alignment system are supplied to a signal-processing circuit SPU, for example, a microcomputer, which processes these signals to control signals Sac for an actuator AC, by means of which the substrate holder WH can be moved in the XY-plane, via the substrate table WT.

The projection apparatus is further provided with a focus-error detection device, not shown in FIG. 1, for determining a deviation between the focal plane of the projection lens system PL and the plane of the radiation-sensitive layer PR. Such a deviation may be corrected, for example, by moving the projection lens system and the substrate relative to each other in the Z-direction, or by moving one or more lens elements of the projection lens system in the Z-direction. An embodiment of such a focus-error detection device, which may be fixed to the projection lens system, is described in U.S. Pat. No. 4,356,392. A detection device by means of which both a focus error and a local tilt of the substrate can be detected is described in U.S. Pat. No. 5,191,200.

Conventionally, the mask pattern C shown in FIG. 1 is a pattern of strips of chrome, or another non-transparent material, on a transparent substrate of, for example, quartz. After imaging such an, amplitude, pattern in the photoresist, the photoresist is developed and the underlying substrate layer is etched and further processed. Either the chrome strips or the clear areas between them, depending on the kind of photoresist, are thereby transferred into grooves in the substrate layer which is momentarily configured. These grooves represent details of the IC structure, for example, gates of transistors. The smallest detail that can be transferred from an amplitude mask pattern is determined by the resolving power, or resolution, of the projection lens system.

As is known, process latitudes and resolution in optical projection lithography can be enhanced, without increasing the numerical aperture of the projection lens system and/or decreasing the wavelength of the projection radiation, by using a phase-shifting mask pattern, instead of an amplitude mask pattern. Process latitudes are understood to be the tolerances of the process parameters, like the illumination dose and the focus of the projection beam relative to the resist layer. In a phase-shifting mask, the details to be printed are represented by phase transitions in the mask pattern at the required positions. A phase transition may be constituted by a transition between a surface of the mask substrate and a recessed area in this surface, or by the transition between said surface and an area of transparent material deposited on this surface.

Figure 2:
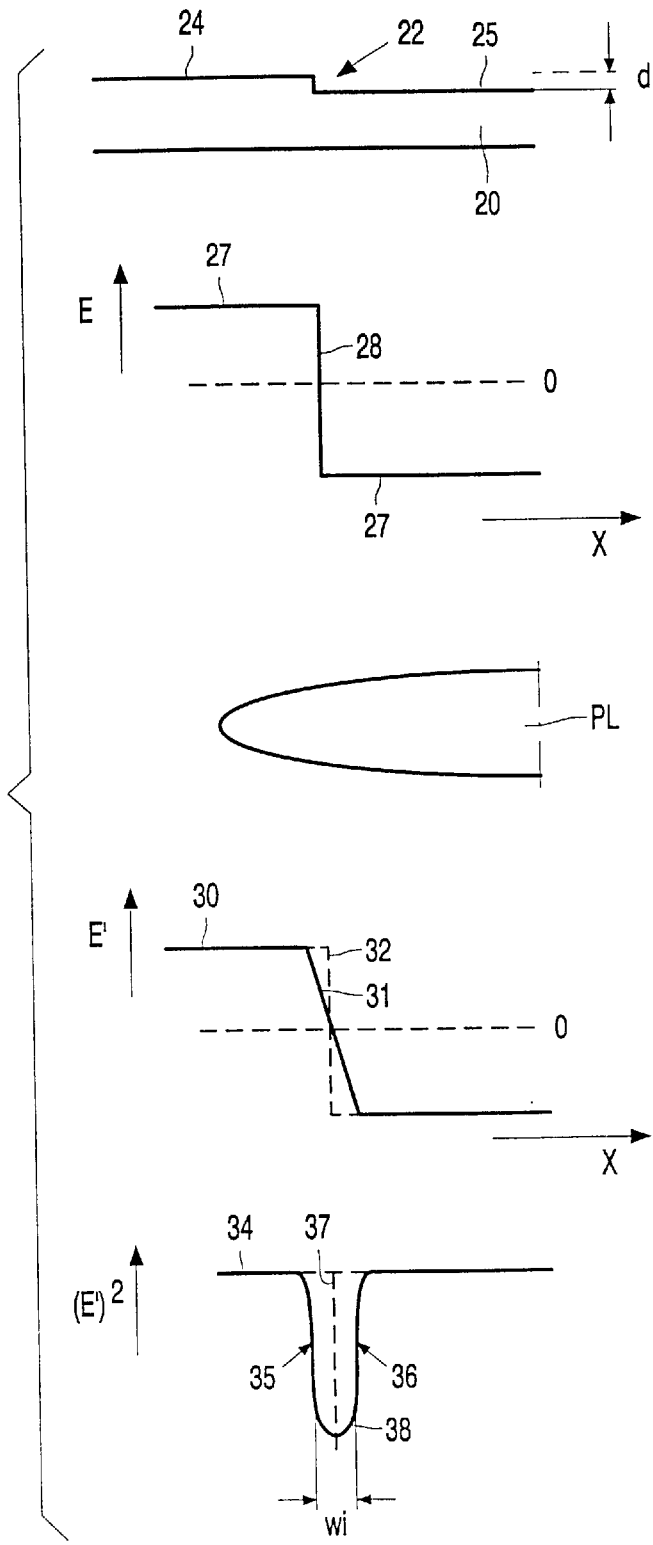
FIG. 2 shows the theory of image formation by a phase shifting mask.

FIG. 2 is a cross-section of a small portion of a phase shifting mask with one such phase transition 22. In this Figure, the reference numeral 20 denotes the transparent mask substrate. The phase transition is the transition between the surface 24 of the substrate and the bottom of a sunk area 25. The depth of this area is d. As the mask substrate is transparent to the projection beam PB, by means of which the mask pattern is imaged in the resist layer, the transition is a phase transition for this beam. This means that, after passing through the mask, the portion of the projection beam PB incident on the area 25 has a different phase than the projection beam portion incident on the surface area 24. The phase difference φ (in radians) between the beam portions is given by $$\phi = (n_2 - n_1) \cdot d \cdot \frac{2\pi}{\lambda}$$

wherein $n_2$ is the refractive index of the mask substrate, $n_1$ is the refractive index of the surrounding medium, which is usually air with $n_1=1$, and λ is the wavelength of the projection beam PB, which is a beam of electromagnetic radiation.

After passage through the phase structure, the size of the electric field vector E of this beam shows the variation as a function of the position x of graph 27. The position of the perpendicular slope 28 in this graph corresponds to the position of the phase transition 22. After passage through the projection lens system PL, shown diagrammatically by means of a single small lens element in FIG. 2, the size of the electric field vector E' shows the variation as a function of the position x of graph 30. The perpendicular slope 28 of graph 27 has been transferred to an oblique slope 31 in graph 30. This is a result of the fact that the projection lens system is not an ideal system, but has a point-spread function, i.e. a point is not imaged as a point but is more or less spread across an Airy pattern during imaging. If the projection lens system were ideal, the electric field vector would have the variation as shown in the broken-line graph 32. The size of the electric field vector represents the amplitude of the projection beam, so that graph 30 shows the amplitude of the beam as a function of the position in the plane of the photoresist layer PR. Since the intensity of the beam is equal to the square of the amplitude (I=E'$^2$), this intensity shows the variation as a function of the position x in graph 34. The edge 31 in graph 30 has changed over to two edges with opposite slopes 35 and 36, which means that a line-shaped phase transition of the phase-shifting mask pattern is imaged in a strip having a certain width wi.

For obtaining a good contrast in the image, the phase difference between the beam portion which has passed through the recess 25 and the rest of the beam must be φ=π rad. This means that the depth d of the recess must be equal to the wavelength of the beam PB if the mask material has a refractive index of 1.5 and the surrounding medium is air having a refractive index of 1. For a practical embodiment, the optimal depth d is, for example, 240 nm. Usable results can still be obtained with depths which are somewhat different from the optimal depth.

Instead of a transmission pattern, also a reflective phase-shifting mask pattern, i.e. a pattern wherein both the recess area 24 and its surroundings 24 are reflective may be used. In the latter case, the optimal depth, or height, of the recess is equal to a quarter of the wavelength.

In a concrete application, the width of the strip imaged in the photoresist is determined by the numerical aperture of the projection lens and the coherence value of the illumination. The width of a device feature, for example a transistor gate, formed in the substrate layer after developing of the photoresist and etching is also dependent on the exposure dose used in the lithographic apparatus. Once the values of the parameters numerical aperture, coherence value and exposure dose are set, all phase transitions of the phase-shifting mask pattern are transferred to strips in the substrate layer all of which have the same width. For example, with an exposure wavelength of 248 nm, a numerical aperture NA=0.63 and a coherence value σ=0.35, a width of the order of 100 nm can be obtained. In practice however, strips with different widths, for example, transistor gates with different lengths in one IC pattern are required.

According to the invention, the minimum width of the strips can be considerably decreased and the width can be varied over a considerable range, without changing the above-mentioned parameters, by adding two assist features to a phase transition.

Figure 3:
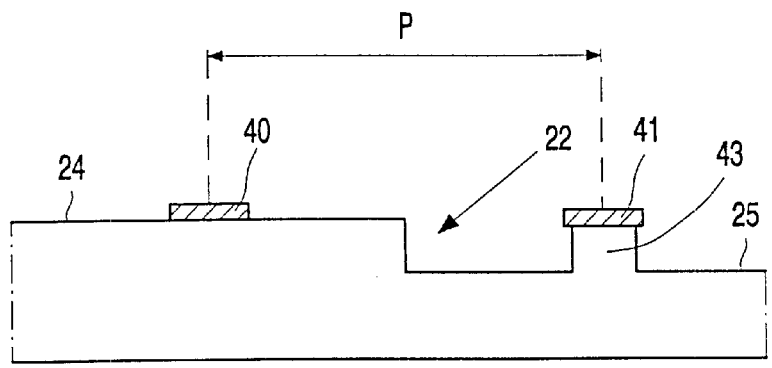
FIG. 3 is a cross-section of a small part of a phase shifting mask according to the invention with a phase transition and two assist features.

FIG. 3. shows the phase transition 22 of FIG. 2 with such assist features 40 and 41 at both sides of the transition. These features have such a small (sub-resolution) width that they are not imaged as such in the photoresist, and are therefore usually called scattering bars. These bars may consist of chrome and have a width of, for example, 300 nm. The bars 40 and 41 are arranged symmetrically with respect to the phase transition 22 and their mutual distance is, for example, 2.5 μm. The bar 40 rests on the upper surface 24 of the mask substrate. To provide a support for the bar 41, a small column 43 of mask substrate material should be saved when making the phase transition. This column can be optimized, for example, by wet etching.

Although the scattering bars 40 and 41 belonging to a phase transition 22 are not transferred to the photoresist layer, they have an effect on the image of the transition. A portion of the exposure radiation incident on a scattering bar is diffracted towards the intensity peak 38 of FIG. 2 and interferes with the radiation of the original intensity peak and thus modifies this peak. The method of the invention uses the insight that the width of the IC feature imaged in the photoresist layer, and thus the width of the IC printed in the substrate layer that is momentarily configured, is mainly determined by the mutual distance between a pair of scattering bars. In addition thereto, also the width of the scattering bars, the transmission of these bars and the phase shift introduced by these bars have their influence on the width of the imaged IC feature.

Figure 4:
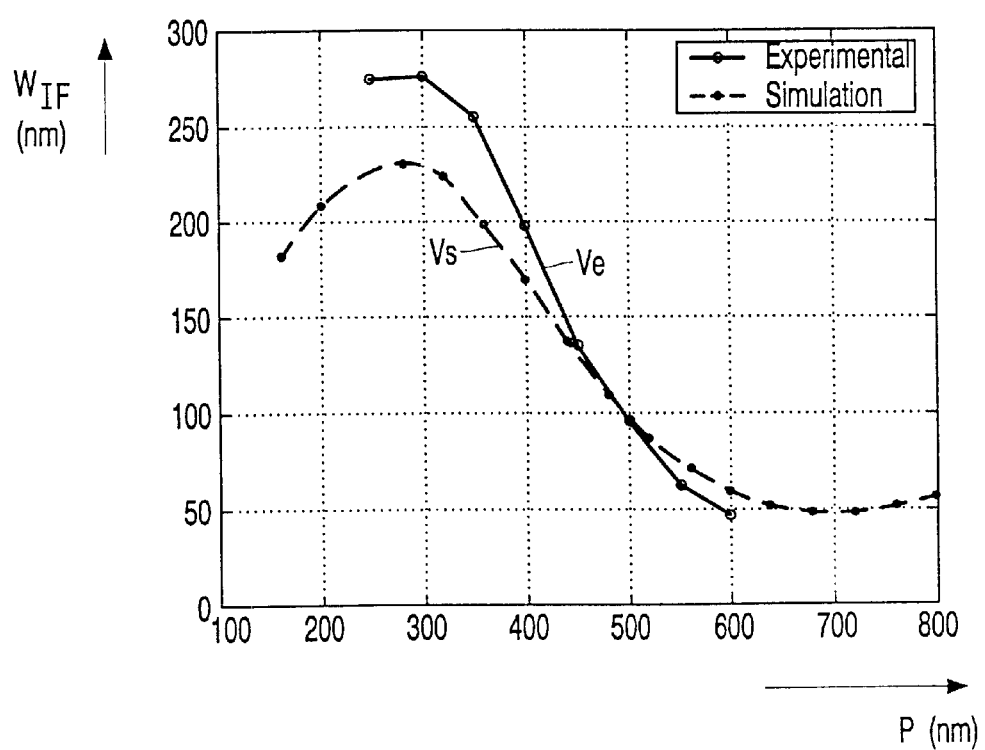
FIG. 4 shows the width of a printed device feature as a function of the mutual distance of these assist features.

FIG. 4 shows the variation of the width of a printed IC feature, also called line width, $w_{IF}$, as a function of the mutual distance, or pitch p, of the scattering bars. For this example, the width $w_b$ of the bars is 90 nm on a substrate layer level, thus 360 nm on the mask level if the projection lens system has a magnification M=¼. The broken-line graph Vs indicates the line width from a computer simulation and the solid-line graph Ve indicates line width values obtained from experiments. The experiments were performed with a stepping lithographic apparatus with a coherence value σ=0.35 and a numerical aperture NA=0.63. The experimental depth of focus was approximately 0.5 μm also for the features with the smallest width and the latitude for the exposure dose was approximately 10%.

The graph Ve in FIG. 4 shows that that the printed IC feature, or line, width $w_{IF}$ decreases if the pitch p increases. It also shows that the printed feature width can be set accurately to any value between 270 nm and 50 nm by simply varying the pitch p of the scattering bars between 250 nm and 600 nm (substrate level). The pair of bars thus allows a choice of a printed device feature width from a broad range, the largest width of this range being more than five times larger than the smallest width. Up to now, scattering bars have only been used as proximity correction bars which are arranged close to the mask features to be imaged, for example, to make the width of only an isolated device feature equal to the width of the same feature in a dense area, as described in the above-mentioned U.S. Pat. No. 5,242, 770. The width of the isolated device feature is thereby changed by at most 10%, which can be called a fine tuning, and the widths of the device features in a dense area are not changed at all.

Figure 5:
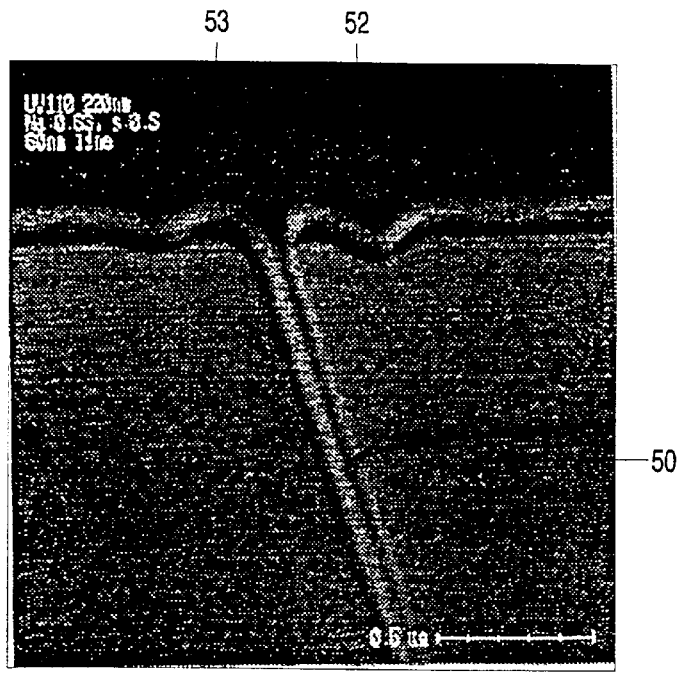
FIG. 5 shows a device feature printed with the new method.

By way of example, FIG. 5 shows a SEM (scanning electron microscope) picture of a 60 nm wide line 50 printed in the resist from a mask phase transition flanked by two scattering bars at a mutual distance of 600 nm (substrate level). The printing was performed by a stepping apparatus using deep UV radiation ($\lambda$=248 nm) and having a numerical aperture NA=0.63 and a coherence value $\sigma$=0.35. The photoresist layer used was 200 nm thick and of the type UV 110 Shipley. The small resist protrusions 52 and 53 at either side of the line corresponds to the positions where the scattering bars are attached to the larger chrome area on the mask.

Figure 6:
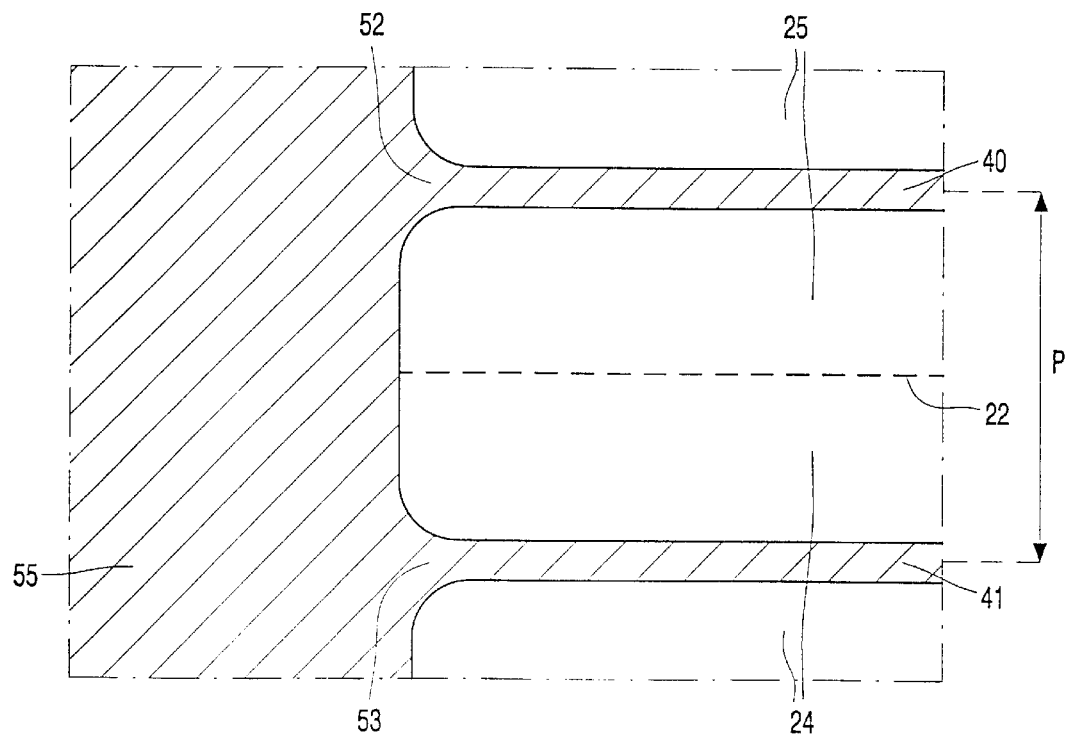
FIG. 6 is a top view of a phase transition with two opaque assist features.

This area is indicated by the reference numeral 55 in FIG. 6 which is a top view of a small part of a phase-shifting mask comprising one phase transition and two scattering bars. The phase transition is indicated by the broken line 22 between the upper surface 24 and the recessed area 25. The areas 24 and 25 are transparent areas and the scattering bars 40 and 41 are opaque. In this example, the bars are made of chrome and attached at the positions 52 and 53 at the chrome area 55.

As already mentioned, the width of the printed device feature is mainly determined by the pitch p of the scattering bars. However, also the width $w_b$ of these bars, their transmission and the phase shift introduced by these bars in the projection beam have their influence on the final width. The parameters $w_b$, transmission and phase can be adapted to tune the width of the printed IC, or another device, feature.

Figure 7:
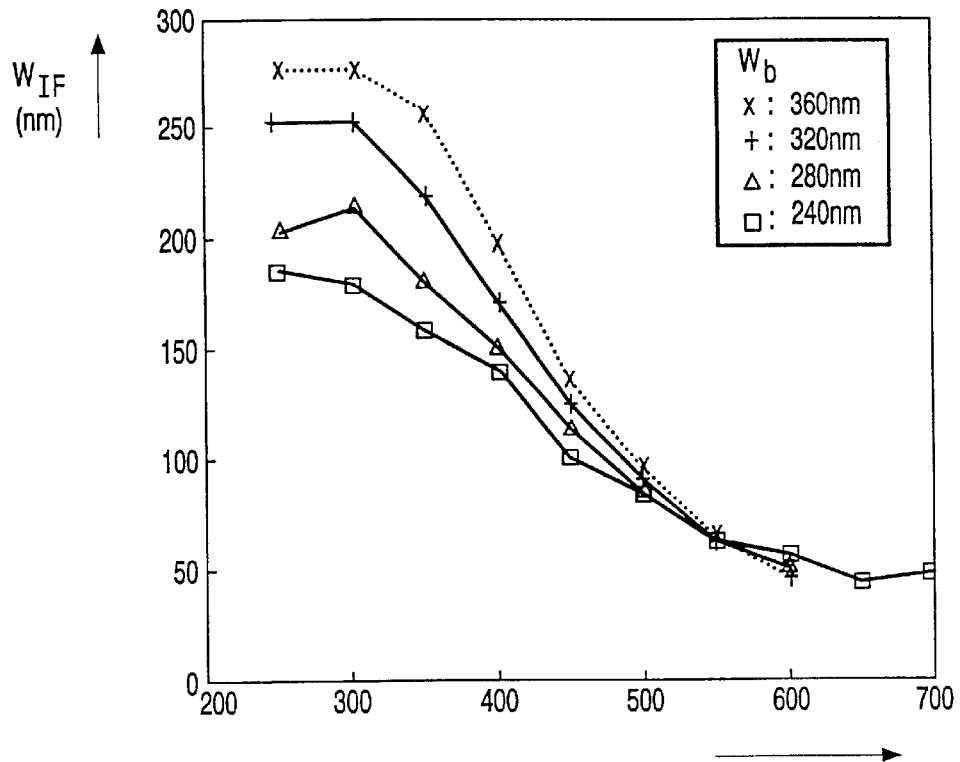
FIG. 7 shows the width of a printed device feature as a function of both the width of the assist features and their mutual distance.

FIG. 7 shows measured values of a printed feature width as a function of the pitch for four different bar widths: 60, 70, 80 and 90 nm, respectively, on substrate level, thus 240, 28, 320 and 360 nm on mask level. For small scattering bar pitches p, below 300 nm, the printed feature width $w_{IF}$ is dependent on the scattering bar width and ranges from about 300 nm, for $w_b$=360 nm, to about 200 nm, for wb=240 nm. For larger pitches, the influence of the bar width decreases and the printed feature width decreases to 50 nm for a pitch of about 600 nm.

In principle, an assist feature may, be constituted by a phase transition instead of by an opaque feature. The width of a phase transition assist feature should be very small in order to prevent that such a feature would be imaged as such in the resist layer. This makes it more difficult to manufacture a mask with assist features in the form of phase transitions.

A better alternative for the opaque assist features is assist features which have a lower transmission, in the case of a transmission mask, than their surroundings. These assist features may be called attenuated assist features and are comparable with the device features of the known attenuated phase-shifting mask. As described in the already mentioned PCT application WO 99/47981, an attenuated phase-shifting mask is a specific embodiment of a phase-shifting mask wherein the device features are constituted by strips having a transmission which is, for example, of the order of 5% smaller than the transmission of their surroundings. Such device features have both a phase effect and an amplitude effect on the projection beam.

According to the present invention, a device feature of the phase shifting mask may be constituted by the combination of a phase transition flanked by two, attenuated, assist features having a transmission which is, for example, of the order of 75% of the transmission of their surroundings. Due to their nature, the attenuated assist features are broader than opaque assist features having the same effect. For example, the width of an attenuated assist feature showing a transmission difference with their surroundings of 75% is 166% of the width of a comparable opaque assist feature. Because of this larger width, the mask with attenuated assist features is easier to manufacture than the mask with opaque assist features.

Figure 8:
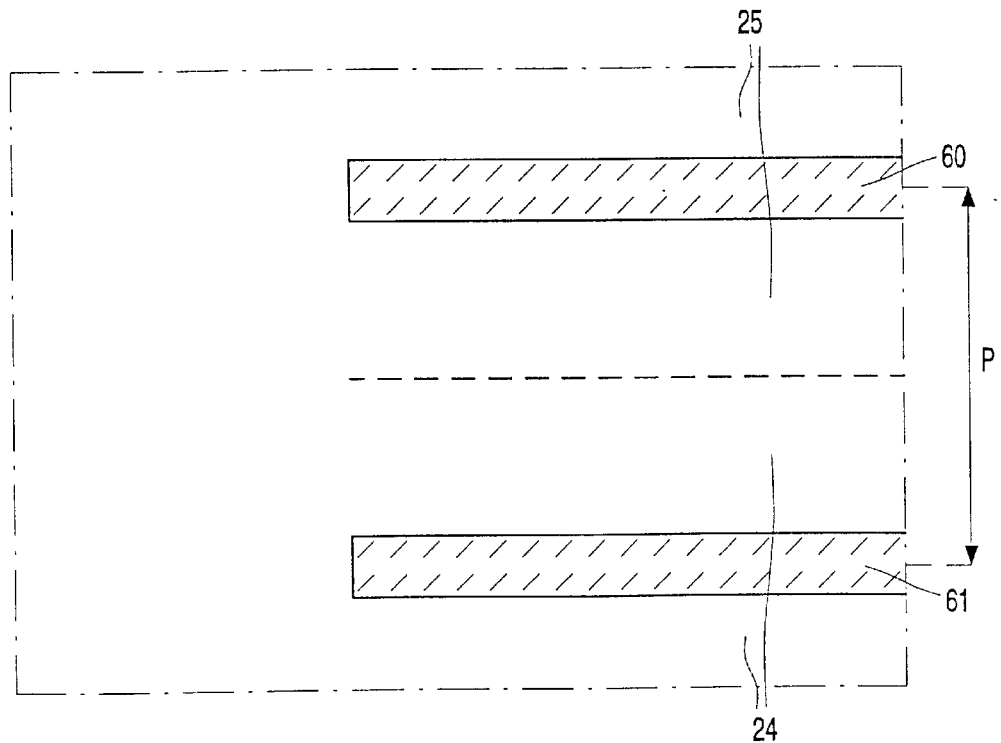
FIG. 8 is a top view of a phase transition with two attenuating assist features.

FIG. 8 shows a portion of a phase-shifting mask comparable with that of FIG. 6 wherein the opaque assist features 41, 42 have been replaced by the attenuating assist features 60,61. The features 60,61 are broader than the features 41,42 and their attenuating effect is visualised by the broken-line hatching. The assist features 60,61 may consist of the material MoSi, which has an appropriate transmission coefficient.

The invention can also be used in combination with the so-called trim mask printing technology. This technology uses two masks which are successively projected in the same area of the photoresist layer. One of these masks is a phase shifting mask with a phase transition at the position of an IC, or another device, feature. This mask is exclusively used to define the position and the length of the IC feature. The second mask, i.e. the trim mask, is a chrome mask which is used to protect the device image features defined by the other mask and to remove unwanted edges produced by the exposure with the first mask. The second mask also defines the remaining interconnect pattern of the device. As explained in the above-mentioned article: "The application of alternating phase-shifting mask to 140 nm gate patterning (2): Mask design and manufacturing tolerances", in one embodiment of the phase-shifting mask, the phase transition structure can be chosen to be such that the width of the printed device feature is independent to a high degree of projection lens aberrations.

Figure 9:
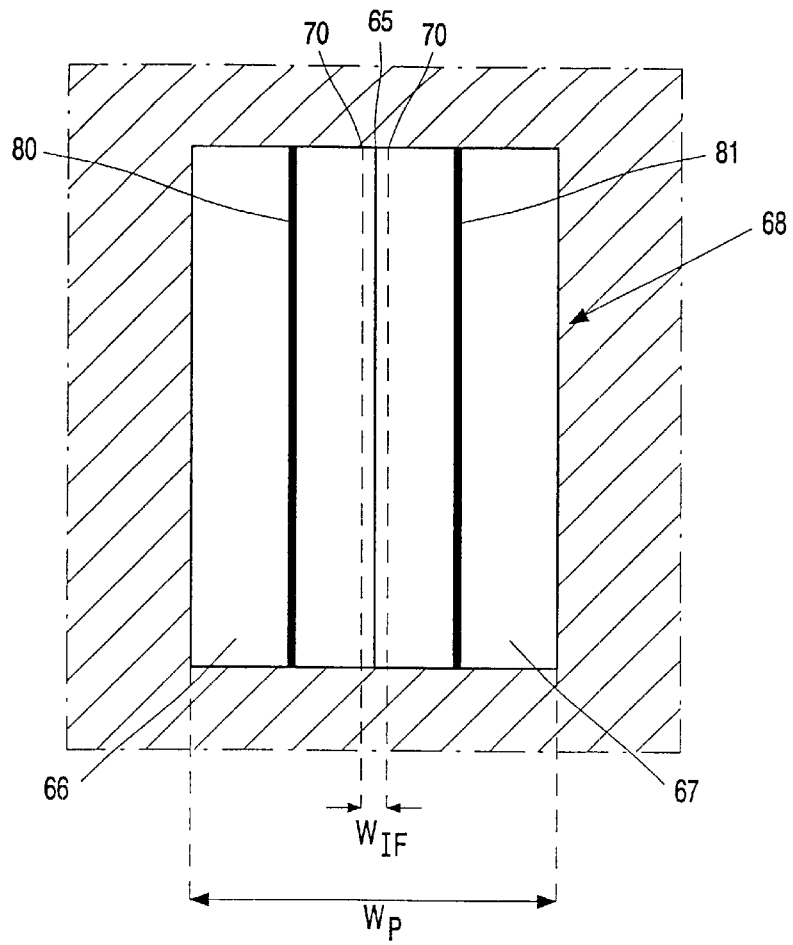
FIG. 9 shows a mask device feature that can be printed without width variations which are induced by aberrations of the projection system.

FIG. 9 is a top view of a small part of this embodiment, which part comprises only one 180° phase transition, indicated by the solid line 65. Reference numeral 66 refers to an area of the surface of the mask substrate and 67 is a recessed area in this substrate. The areas 66 and 67 together can be called a phase-shifting area 68. The latter area is surrounded by opaque material, for example, chrome. When the mask device feature of FIG. 9 is illuminated, a strip-like image having a width $w_{IF}$ is formed in the photoresist layer. This image is represented by the broken lines 70 in FIG. 9. This width is determined by the width $w_p$ of the phase-shifting area 68.

Figure 10:
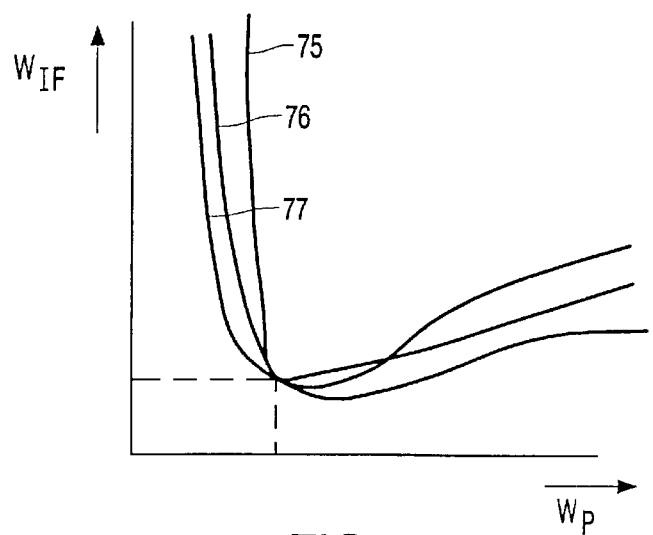
FIG. 10 shows the variation of the width of a printed device feature as a function of the mutual distance of the assist features for different types of aberration of the projection system.

It is known that the width of the image of a mask device feature is dependent on the different types of lens aberrations of the projection lens system. This is schematically illustrated in FIG. 10. In this Figure, the variation of the width $w_{IF}$ of the device feature image as a function of the phase-shifting area width $w_p$ is shown, in arbitrary units, for different types of lens aberrations. Each graph 75,76 and 77 in FIG. 10 represents a different type of lens aberration, for example, coma, astigmatism, spherical aberration. As shown in FIG. 10, there is one certain width $w_{IF(n)}$ for the imaged device feature on which the different types of lens aberrations have the same small influence. The imaged device feature can be tuned to this, nominal, width by setting the width of the phase-shifting area to the, nominal width $w_{p(n)}$. With this method, however, only one nominal, or aberration-independent, width can be set so that, for configuring a device with different feature widths, the advantage of this method cannot be obtained for the different feature width present in the device.

According to the present invention, it is possible to realize an aberration-independent printed width for the different feature width present in a device by arranging two assist features in the phase-shifting area 68. In FIG. 9, these assist features are represented by the fat solid lines 80 and 81. Once it has been established what the nominal width $w_{p(n)}$ of the phase-shifting area 68 should be for one device feature width, the nominal printed feature width for other device feature widths can be realised by setting the mutual distance between the assist features 80 and 81, thereby maintaining the width of the phase-shifting area.

The method of printing device features having a width which is substantially independent of aberrations of the projection system can also be used with a lithographic projection apparatus having a projection system which consists of, or comprises mirrors. This method can also be used outside the trim mask technology, thus without the use of a trim mask and double exposure.

In the above description, it has been assumed that the phase-shifting mask is a transmission mask. The invention may also be implemented with, or in, a reflective phase shifting mask. The assist features in such a mask may also be opaque, i.e. non-reflective or absorbing, features, or attenuating features, i.e. features having a smaller reflection coefficient than their surroundings.

The invention has been described with reference to a lithographic projection apparatus wherein DUV radiation is used as the projection radiation, but this does not mean that its application is limited thereto. The invention may also be used in lithographic apparatus wherein other types of projection radiation, such as UV radiation and EUV radiation, are used. Furthermore, the invention is not limited to the manufacture of integrated electronic circuits, but may also be used in the manufacture of other devices like integrated or planar-optical systems, thin film magnetic heads, liquid crystal display panels, etc.

What is claimed is:

1. A method of manufacturing a device in at least one layer on a substrate, comprising the steps of:

imaging, by means of projection radiation having a wavelength $\lambda$ and a projection system having a numerical aperture NA, a specific phase shifting mask pattern, comprising pattern features corresponding to device features to be configured in said layer, on a radiation-sensitive layer provided on said layer, and removing material from, or adding material to, areas of said layer which are delineated by the mask pattern image, the smallest device features having a width which is smaller than $\lambda/NA$, characterized in that use is made of a mask pattern comprising mask features which are constituted by the combination of a phase transition determining the position of the imaged mask feature in the device layer and the length of the imaged mask feature, and two sub-resolution assist features flanking the phase transition and having a specific mutual distance which substantially determines the width of the imaged mask feature in the device layer, and wherein imaged mask features having substantially different widths can be produced in the device layer by varying the mutual distance of the respective assist features on the mask pattern.

2. A method as claimed in claim 1, characterized in that the width of the imaged mask feature is tuned by adapting at least one of the following parameters:

the width of the assist features;

the transmission of the assist features, and the phase shift introduced by the assist features.

3. A method as claimed in claim 1 or 2, characterized in that use is made of a mask pattern wherein the assist features are constituted by opaque strips.

4. A method as claimed in claim 1 or 2, characterized in that use is made of a mask pattern wherein the assist features are constituted by radiation attenuating strips.

5. A method as claimed in claim 1 or 2, characterized in that use is made of a mask pattern wherein the phase transitions are arranged in phase shifting areas which are embedded in opaque surroundings, and the assist features belonging to a specific phase transition are arranged within its phase-shifting area.

6. A lithographic phase-shifting mask for use with the method as claimed in claim 1 for optically transferring a mask pattern, corresponding to a device layer structure, from said mask to a layer on a substrate, characterized in that said mask pattern comprises mask features which are constituted by the combination of a phase transition determining the position of the imaged mask feature in the device layer and the length of the imaged mask feature, and two sub-resolution assist features flanking the phase transition and having a specific mutual distance, which distance substantially determines the width of the imaged mask feature in the device layer.

7. A lithographic phase-shifting mask as claimed in claim 6, characterized in that the phase transitions are arranged in phase-shifting areas which are embedded in opaque surroundings, and the assist features belonging to a specific phase transition are arranged within its phase-shifting area.

8. A lithographic phase-shifting mask as claimed in claim 6 or 7, characterized in that the mask pattern is a transmission pattern.

9. A lithographic phase-shifting mask as claimed in claim 6 or 7, characterized in that the mask pattern is a reflective pattern.

10. A lithographic phase-shifting mask as claimed in claim 6 or 7, characterized in that the assist features are constituted by opaque strips.

11. A lithographic phase-shifting mask as claimed in claim 10, characterized in that the material of the strips is chrome.

12. A lithographic phase-shifting mask as claimed in claim 6 or 7, characterized in that the assist features are constituted by radiation attenuating strips.

13. A lithographic phase-shifting mask as claimed in claim 12, characterized in that the material of the strips is a composition of molybdenum and silicon.

* * * * *